United States Patent
Cranford, Jr. et al.

(10) Patent No.: US 7,684,478 B2
(45) Date of Patent: Mar. 23, 2010

(54) GENERATING AN EYE DIAGRAM OF INTEGRATED CIRCUIT TRANSMITTED SIGNALS

(75) Inventors: Hayden C. Cranford, Jr., Cary, NC (US); Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 773 days.

(21) Appl. No.: 11/427,831

(22) Filed: Jun. 30, 2006

(65) Prior Publication Data
US 2008/0002762 A1 Jan. 3, 2008

(51) Int. Cl.
H04B 17/00 (2006.01)
H04L 27/06 (2006.01)
(52) U.S. Cl. ........................ 375/226; 375/316
(58) Field of Classification Search ................. 375/226, 375/316, 224, 371; 702/69, 106, 180; 327/164, 327/74, 77
See application file for complete search history.

(56) References Cited

U.S. PATENT DOCUMENTS

| | | | |
|---|---|---|---|
| 5,889,435 A | 3/1999 | Smith et al. | |
| 6,295,315 B1 | 9/2001 | Frisch et al. | |
| 6,366,631 B1 | 4/2002 | Nakayama et al. | |
| 6,522,122 B2 | 2/2003 | Watanabe et al. | |
| 6,640,103 B1 | 10/2003 | Inman et al. | |
| 6,661,836 B1 | 12/2003 | Dalal et al. | 375/226 |
| 6,728,311 B1 | 4/2004 | Waschura et al. | |
| 6,785,622 B2 | 8/2004 | Nygaard, Jr. | |
| 6,836,738 B2 | 12/2004 | Sepp et al. | |
| 6,841,985 B1 | 1/2005 | Fetzer | |
| 6,871,152 B2 | 3/2005 | Nygaard, Jr. | |
| 6,934,648 B2 | 8/2005 | Hanai et al. | |
| 6,977,534 B2 * | 12/2005 | Radelinow | 327/112 |
| 7,383,160 B1 * | 6/2008 | Cranford et al. | 702/189 |
| 2002/0103609 A1 | 8/2002 | Kuyel | |
| 2002/0118738 A1 | 8/2002 | Whitlock | |

(Continued)

OTHER PUBLICATIONS

U.S. Appl. No. 11/279,651, filed Apr. 13, 2006, Cranford, Jr. et al.

(Continued)

*Primary Examiner*—Khai Tran
(74) *Attorney, Agent, or Firm*—Garg Law Firm, PLLC; Rakesh Garg; Libby Z Handelsman

(57) ABSTRACT

A sequence of K voltage samples of a transmitted data signal is generated by sampling, digitizing, and storing voltage samples of the data signal with an imbedded sample clock on an IC having an unknown period TS. The K voltage samples are plotted against a time base of K sequential times TB[K] normalized so all samples fall within one cycle of the data clock used to generate the data signal or a unit time of 1. The time base is generated by estimating the sample clock period TSE to be some multiple of 1/P where P is greater than K. Eye diagrams are analyzed for time jitter wherein only the minimum value of jitter is saved. TSE is incremented by 1/P until TS is greater than one half the data clock period. The eye diagram at the TSE with the minimum time jitter is used to analyze the data channels.

20 Claims, 13 Drawing Sheets

U.S. PATENT DOCUMENTS

| | | |
|---|---|---|
| 2004/0143406 A1 | 7/2004 | Nishikobara et al. |
| 2005/0036578 A1 | 2/2005 | Heidel et al. |
| 2005/0069031 A1 | 3/2005 | Sunter et al. |
| 2005/0107970 A1 | 5/2005 | Franch et al. |
| 2005/0177758 A1 | 8/2005 | Stickle |

OTHER PUBLICATIONS

Jenkins, et al.,"An On-Chip Jitter Measurement Circuit with Sub-picosecond Resolution", Proceedings of ESSCIRC, Grenoble, France. Jan. 2005.

Restle, et al., "Timing Uncertainty Measurements on the Power5 Microprocessor", IEEE 2004 Solid-State Circuits Conference, Jun. 2004.

Xia, et al., "Self-Refereed on-chip Jitter Measurement Circuit Using Vernier Oscillators", Proceedings of the IEEE Computer Society Annual Symposium on VLSI, IEEE, 2005, US.

Ong, et al. "A Scalable On-Chip Jitter Extraction Technique" Proceedings of the IEEE VLSI Test Symposium 2004, IEEE, 2004, US.

Larsson, et al. "Measuring high-bandwidth signals in CMOS circuits", Electronics Letters, vol. 29, No. 30, Sep. 1993, IEE.

Ho, et al., "Applications of On-Chip Samplers for Test and Measurement. of Integrated Circuits", 1998 VLSI Symposium, IEEE, 1998.

Takamiya, et al., "An On-chip 100GHz-Sampling Rate 8-channel Sampling Oscilloscope with Embedded Sampling Clock Generator", 2002 ISSCC.

Abaskharoun, et al., "Strategies for On-chip Sub-nanosecond Signal Capture and Timing Measurements", IEEE, 2001, US.

Ong, et al. "Jitter Spectral Extraction for Multi-gigahertz Signal", (DAC) IEEE, 2004, US.

PCT International Search Report, PCT/EP2007/056087, mailed Sep. 23, 2007.

PCT Written Opinion of the International Search Authority, PCT/EP2007/056087, mailed Sep. 23, 2007.

PCT International Search Report, PCT/EP2007/056054, mailed Sep. 25, 2007.

PCT Written Opinion of the International Search Authority, PCT/EP2007/056054, mailed Sep. 25, 2007.

\* cited by examiner

GENERATING AN EYE DIAGRAM OF INTEGRATED CIRCUIT TRANSMITTED SIGNALS

GOVERNMENT RIGHTS

This invention was made with Government support under PERCS II, NBCH3039004. The Government has certain rights in this invention.

CROSS REFERENCE TO RELATED APPLICATION

The present invention is related to the following U.S. Patent Application which is incorporated by reference:
Ser. No. 11/427,860 entitled "Method And Apparatus for Constructing a Synchronous Signal Diagram From Asynchronously Sampled Data", filed Jun. 30, 2006, now, U.S. Pat. No. 7,383,160.

TECHNICAL FIELD

The present invention relates in general to board level transmission line drivers and receivers, and in particular, to methods of testing data channels transmitting data between integrated circuits driving transmission lines coupling elements on circuit boards.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (crosstalk) affects signal quality. One way to alleviate the detrimental effects of noise and coupling is through the use of differential signaling. Differential signaling comprises sending a signal and its complement to a differential receiver. In this manner, noise and coupling affect both the signal and the complement equally. The differential receiver only senses the difference between the signal and its complement as the noise and coupling represent common mode signals. Therefore, differential signaling is resistant to the effects that noise and crosstalk have on signal quality.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. For differential signaling, parallel transmission lines are used. Each transmission line may be terminated with respect to their individual characteristic impedance or the differential pair may be terminated with a resistance between the two transmission lines equal to the differential line impedance.

Transmission line systems are characterized by noise, propagation speed, losses, and reflections due to imperfect terminations. Therefore, received signals do not transition between logic levels in a repeatable fashion. Even when triggered to transition to a logic level at the same clock time, line drivers may not do so exactly the same every time. These variations in timing and voltage levels may be viewed by using an oscilloscope system to view a received signal in a time window. A snapshot of the signal during this time window may be displayed by triggering the oscilloscope system to start the time sweep at a clock time synchronous with the clock that generated the data signal. The resulting logic state transitions of the data signal will appear as an "eye diagram" wherein the rise and fall times and the logic one and logic zero voltage levels will be "smeared" to an extent depending on their variability with respect to the triggering clock transitions and any variability in the measuring system.

There is no "one" eye diagram for a data transmission system as the resulting display will depend on how the clock trigger signal at the receiver was derived. Some examples of possible trigger signals are the following:

1) a clock signal trigger at the same rate and synchronous with the data signal.
2) a divided clock trigger signals at some divide ratio of the data rate often related to a power of 2, e.g., 4, 16, etc.
3) a pattern trigger which is a signal that provides a trigger once per pattern repetition.
4) the data itself may be used as a trigger.
5) lastly, the trigger signal is derived by using clock recovery on the data signal.

Each of these methods provide different results when used to construct the eye pattern. The clock trigger in 1) provides a classical eye diagram containing all possible bit transitions in one display. The divided clock trigger in 2) also produces an eye diagram, and this may be useful when the instrument being used to generated the eye diagram has a trigger input bandwidth lower than the data rate of the signal being viewed. This method will produce a good eye diagram unless the pattern length of the data signal divided by the divide ratio is an integer. In this cases the trigger signal will coincide with the same bits in the pattern each time while consistently missing other parts of the pattern. This will lead to an incomplete eye diagram.

The pattern trigger in 3) is used to display individual bits in the data pattern. If the pattern is long and the view time encompasses only a few bit transitions, then a particular group of bits will be viewed each triggered sweep. To view the entire pattern, requires that the view time trigger be delayed from the pattern trigger. This is done using the scope time base and may lead to increased apparent jitter on the displayed signal due to weaknesses in the time base circuitry.

Triggering on the data in 4) is the least desirable method of constructing the eye diagram and should only be used as a quick look-see. Long runs of identical characters provide no transitions to trigger from and so a complete eye diagram is almost impossible to achieve.

Triggering on a recovered clock in 5) while entailing increased complexity does have some advantages as listed:
Works well when the actual clock signal is not available
In cases when the distance between transmitter and receiver is very long, the relationship between the received data and transmit clock may be corrupted
Some standards require analysis of the eye diagram as "seen" by the receiver, especially for jitter testing Circuits that are used for clock recovery typically have a loop bandwidth that removes jitter from the recovered clock signal that is present on the data signal. Depending on the measurements to be made this affect may be good or bad and needs to be understood.

Narrow loop bandwidth in clock recovery gives a stable clock as the reference and any jitter in the data eye diagram will be displayed. This is a useful absolute measure but might not properly represent the jitter "seen" by a real system if the receiver also uses clock recovery to track the data to remove jitter.

Wide loop bandwidth lets through more of the jitter in the recovered clock signal. This results in the recovered clock tracking the jitter in the data signal so that the resulting eye diagram may have very little jitter present. Conversely, if there is delay between the data signal and the trigger signal, then the delayed recovered clock trigger may be moving in opposite direction from the data signal resulting in the eye diagram showing twice as much jitter as was present on the data signal.

While these various ways of generating a trigger signal result in variable eye diagrams, most measurement standards specify what type of trigger scheme is required to make particular measurements.

While eye diagrams provide accessible and intuitive view of parametric performance, data systems are ultimately judged on their ability to transmit data with low error rates. Error testing will provide an overall measure of how well a system is performing but does little to help in understanding the underlying causes for lower that expected performance.

A perfect eye diagram would show all parametric aspects of all possible bit sequences no matter how infrequent some effects may occur. This would result in a "high information depth." However, eye diagrams are typically composed of voltage/time samples of the original data that are acquired at some sample rate that may be orders of magnitude slower that the actual data rate. For sampling oscilloscopes, this may be $10^5$ samples per second for a 10 Gb/s (digital pattern 1010) rate. This means that the eye diagrams so acquired would be "information shallow."

This becomes a problem when issues arise that are occur infrequently. For example, these may be pattern related, noise related, or may be related to other effects such as crosstalk and other forms of interference. These conditions may not present themselves on a sampled oscilloscope eye pattern but may operate to prevent a transmission link from achieving desired performance levels. For example, a transmission link may be required to have better than one error in $10^{12}$ while the acquired eye diagrams struggle to show events with probabilities below an occurrence rate of 1 in $10^5$.

Eye diagrams provide useful information about characteristics of transmitted data signals and a variety of techniques have been developed to generate and analyze eye diagram data. Integrated circuits (ICs) have I/O speeds that make it desirable to use the techniques without having to interface the signals under test over long distances to a tester. It obviously would be desirable to acquire the voltage/time data on-chip and then have the ability to reconstruct the eye-diagram without the limitations of a display oscilloscope.

Modern computer systems can have hundreds of communication channels per die, making it impractical to view the eye diagram of each individual channel using external test equipment. One solution might be to incorporate components used in a traditional sampling oscilloscope (i.e., trigger, delay line and sampler) near the termination or sample latch of each receiver. However, distribution of a high speed synchronous trigger signal across hundreds of channels is impractical. If the system clock or a locally recovered clock is used, then a variable delay line is required for each sampler. In modern CMOS processes, it is exceptionally difficult to realize a delay line with both fine resolution (i.e., less than an inverter delay—a few picoseconds) and with a large delay range (hundreds of picoseconds). Delay lines often have poor accuracy, high power dissipation and large area, making them impractical for use on a per-channel bases.

In addition, the frequency of the system clock is often dithered slightly to avoid radiation at a particular frequency. In synchronous links, the system clock is common so the frequency deviation is tracked across all communication links. In asynchronous systems, a clock and data recovery block is used on a per channel basis to track the frequency offset of any incoming data signal. Any solution for measuring the eye diagram must have the ability to overcome frequency drift.

There is, therefore, a need for a method of acquiring the data necessary to construct an eye diagram using low power, area efficient, on-chip circuitry that does not require either specific clock frequency synchronization or a highly stable clock source.

SUMMARY OF THE INVENTION

In an integrated circuits (ICs) under test, the ICs have built in circuitry that facilitates the measurement of eye diagrams to determine the overall quality of signaling. Received data signals are voltage sampled with an on-chip clock signal wherein the frequency of both the sample clock and the system clock may be unknown. The sampled voltage data represents voltages acquired at specific time intervals, wherein the time interval or sample period is unknown. Statistical techniques are used to determine the jitter of the eye pattern representation of the data where the voltage samples are stored as a function of a unitized time base. The eye pattern is regenerated forming a set of eye patterns by "sweeping" the acquisition frequency from a period of substantially 0 to a period of T/2, wherein T is the period of the data signal clock. The time base for the eye pattern is chosen as the value of sample period that achieves the minimum eye pattern jitter as this corresponds to the actual period of the on-chip clock when the received data signals were sampled. A test eye pattern is then generated using this sample time period of minimum eye pattern jitter. The test eye pattern is then used to observe and potentially optimize signal path parameters for the system under test.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
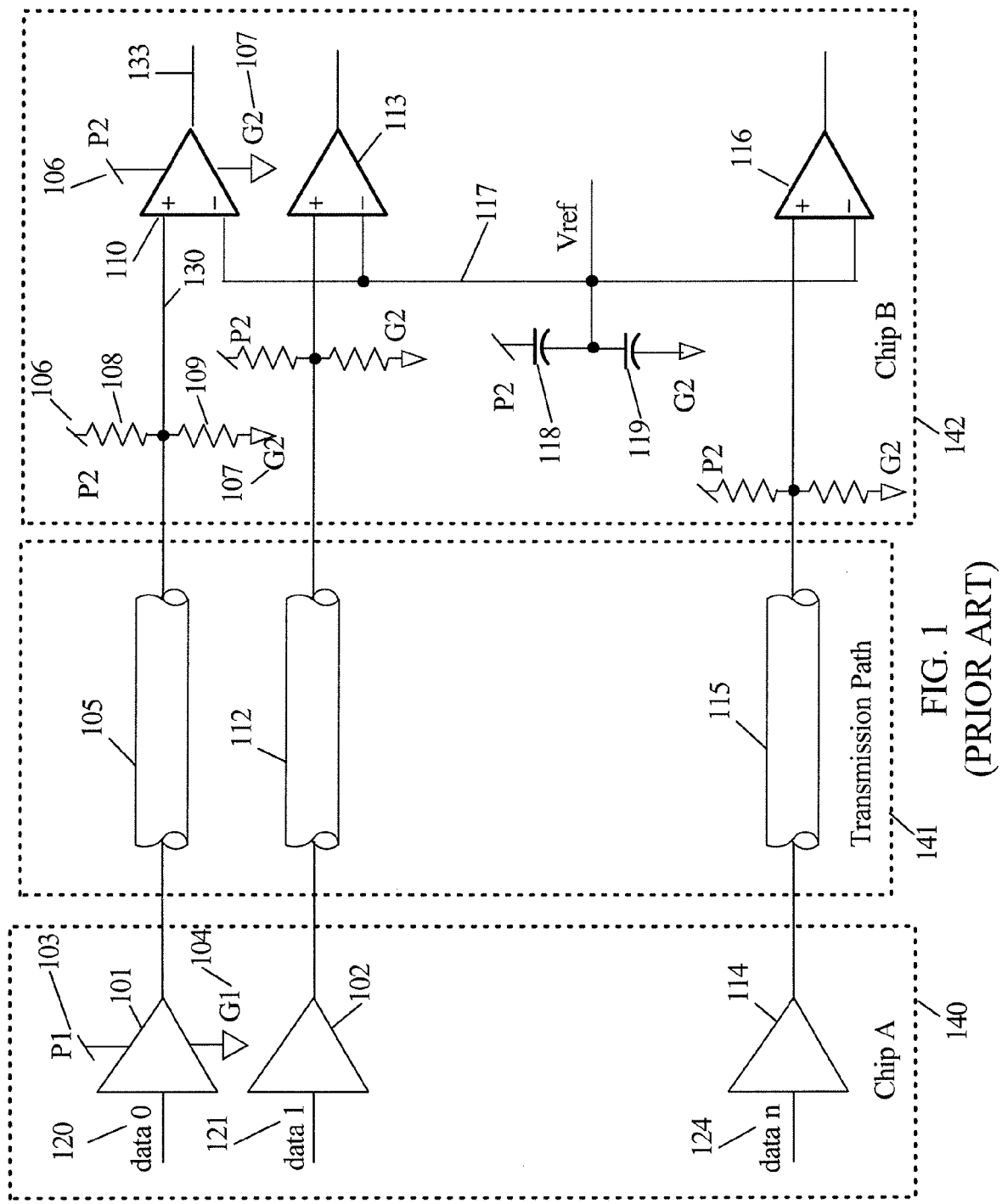
FIG. 1 is a prior art circuit diagram of data channels using pseudo differential signaling.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

An explanation of how timing jitter of a eye pattern used in embodiments of the present invention may be determined is found in the publication: "Firmware Measurement Algorithms for HP 83480 Digital Communications Analyzer", Hewlett-Packard Journal, 1996, which is hereby incorporated by reference herein.

Refer now to the drawings wherein depicted elements are not necessarily shown to scale and wherein like or similar elements are designated by the same reference numeral through the several views.

FIG. 1 is a circuit diagram of typical pseudo-differential signaling for transmitting data from drivers in a Chip A 140 to receivers in a Chip B 142 via a transmission path 141. Drivers 101, 102 and 114 represent three of a number of n drivers sending data to receivers 110, 113 and 116, respectively. Exemplary driver 101 receives data 0 120 and generates an output that swings between power supply rail voltages P1 103 (logic one) and G1 104 (logic zero). When the output of driver 101 is at P1 103, any noise on the power bus is coupled to transmission line 105 along with the logic state of the data signal. Exemplary transmission line 105 is terminated with a voltage divider comprising resistors 108 and 109. Receiver input 130 has a DC bias value determined by the voltage division ratio of resistors 108 and 109 and the voltage between P2 106 and G2 107. Receiver 110 is powered by voltages P2 106 and G2 107 which may have different values from P1 103 and G1 104 due to distribution losses, noise coupling, and dynamic impedance of the distribution network. Exemplary receiver 110 is typically a voltage comparator or high gain amplifier that amplifies the difference between a signal at input 130 and a reference voltage Vref 117. Voltage reference Vref 117 may be programmable and generated by a variety of techniques.

Figure 2:
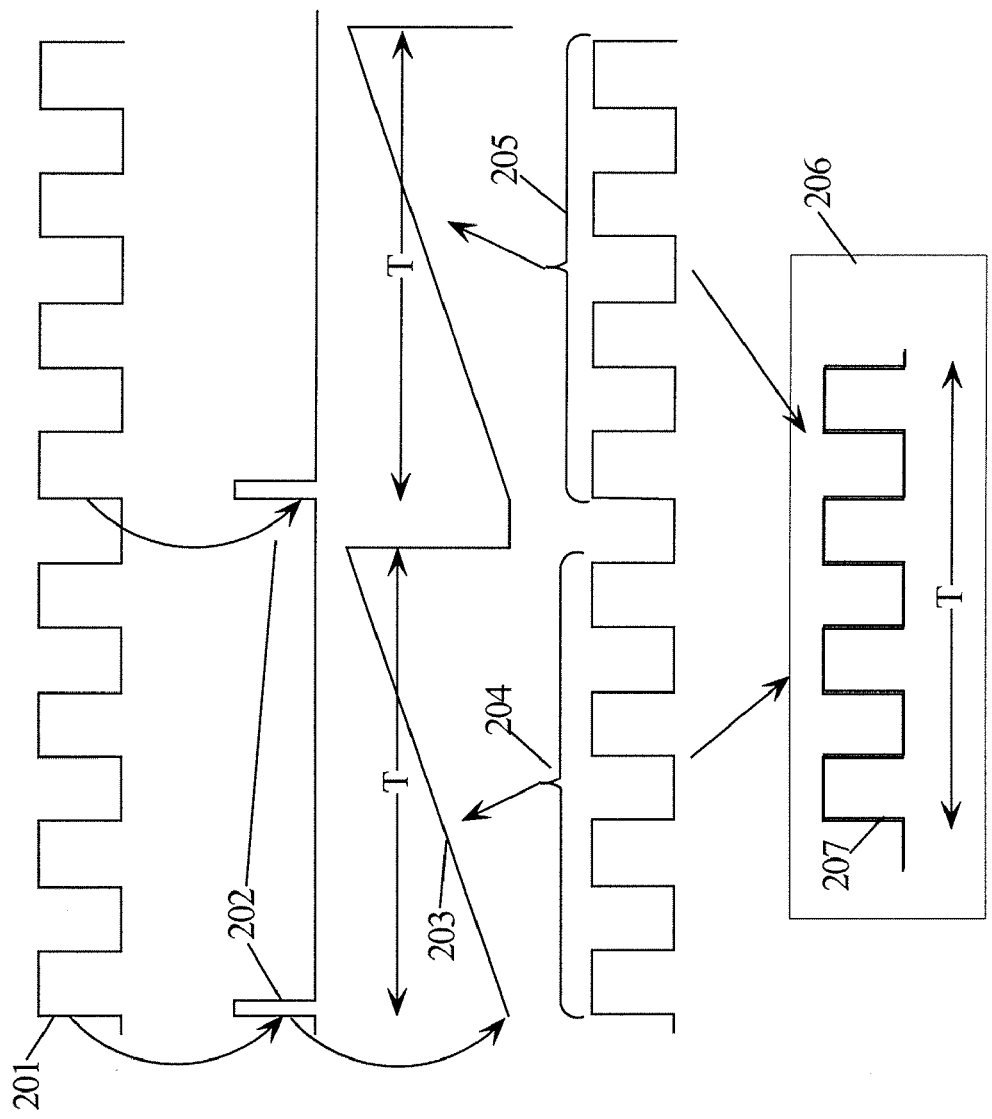
FIG. 2 illustrates waveforms resulting from displaying portions of a signal using a triggering system.

FIG. 2 illustrates waveforms that may be observed when viewing a data clock 201 on an oscilloscope (note shown). Trigger pulses 202 are shown generated on a positive transition of data clock 201. If the display oscilloscope is analog, then a sweep voltage 203 is generated that moves the electron beam of the oscilloscope across the viewing screen 206. If sweep voltage 203 is linear and calibrated, then the beam will transition in a specific time forming a continuous time base scale of the display. The first sweep will display cycles 204 of data clock 201. After the viewing screen sweep is complete, the beam retraces and the next positive transition allows viewing of another portion 205 of data clock 201. Cycles 204 and 205 will be superimposed even though they occur at different real times. This process continues and the voltage levels and timing transitions will experience a widening when displayed depending on the stability of data clock 201 and the stability of the display itself. If the signal being observed is a data signal with logic one and logic zero transitions occurring at particular data clock transitions, then both positive and negative transitions will be observed at the same apparent data clock times. This is the basis for generating an eye diagram used in embodiments of the present invention.

Figure 3:
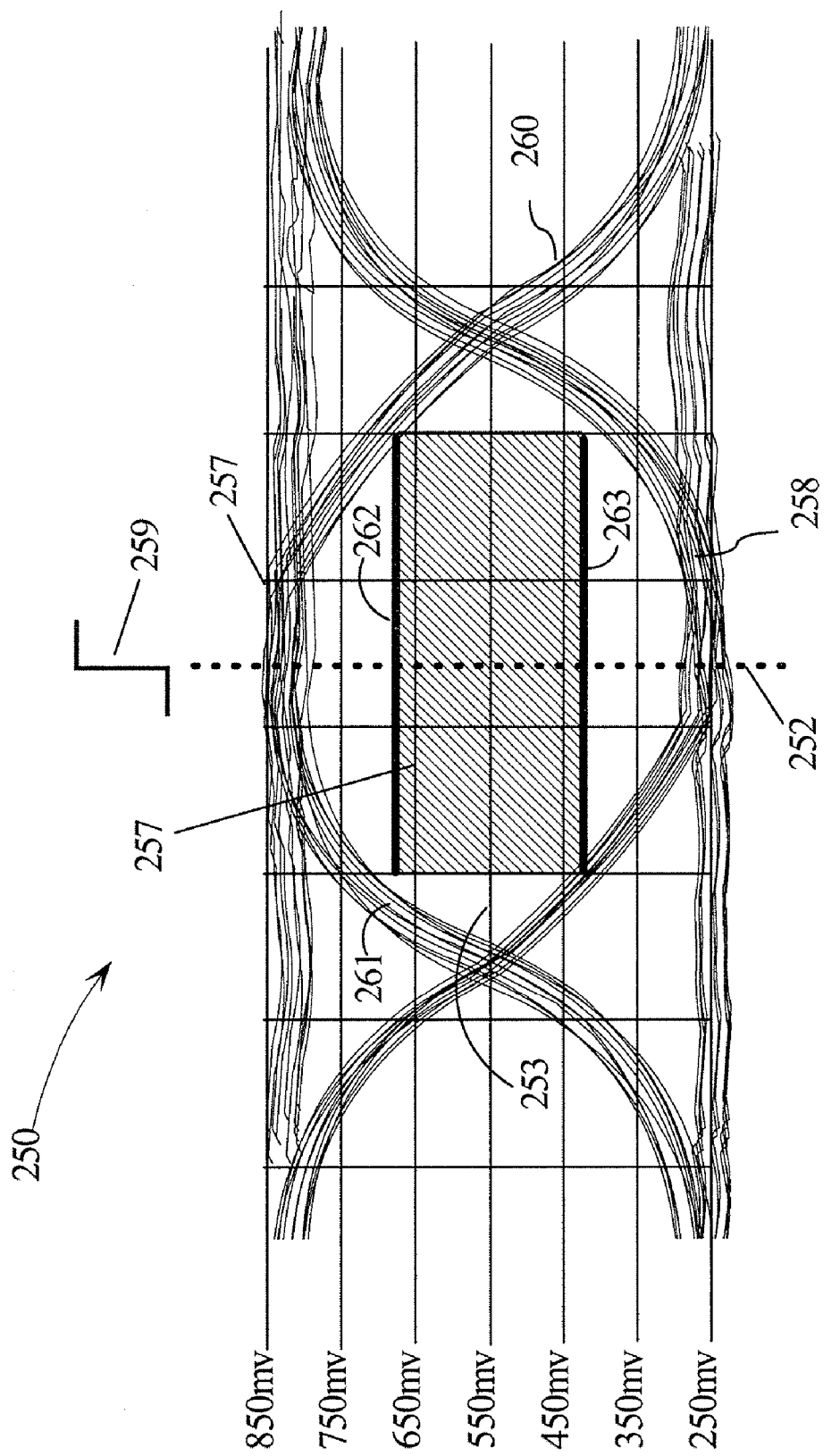
FIG. 3 illustrates characteristics of an eye diagram for analyzing a data channel.

FIG. 3 illustrates an eye diagram of a data signal 250. Various signal characteristics may be monitored in determining what metric to use in setting an optimum value of variables affecting the data signal 250 eye pattern. FIG. 3 illustrates a superposition of traces of a signal 306 received over a transmission line (TL) (e.g., 315). FIG. 3 defines what is meant by the "eye window" of a waveform as discussed in embodiments of the present invention. If one displays a data signal generated in response to a data clock, then all of the data transitions will overlap with a tolerance corresponding to timing jitter. A time lapse oscillograph of the data signal show that the waveform transitions between a logic one and a logic zero actually vary (e.g., positive transitions 261 and negative transitions 260). The actual voltage levels corresponding to a logic one (257) and a logic zero (258) also show dynamic variances. The "eye window" is illustrated by 257, wherein the data is considered valid. Voltage level 262 illustrates the voltage above which a received signal is defined as a logic one and level 263 illustrates the voltage below which a received signal is defined as a logic zero. The crossover point 253 (voltage 550 mV) may be an ideal threshold voltage for a receiver. The voltage between 262 and 257 may be called the positive signal-to-noise margin and the voltage between 263 and 258 may be called the negative signal-to-noise margin. Noise margins may be one way to determine an optimum value to use to set a reference voltage (e.g., Vref 307) for detecting a data signal 306 to generate a detected data signal at receiver output 314.

If the data signal 250 was sampled by a clock transition 259, it would be ideal to have the clock transition occur at time 252 where the data window 257 gives the best margins. If the clock 259 sample time 252 moved to the left or right of window 257, then errors may be more frequent. Using this criteria, it can be said that positioning data 250 relative to clock 259 as shown would have maximized the eye pattern window for detecting the logic states of data 250.

Figure 4:
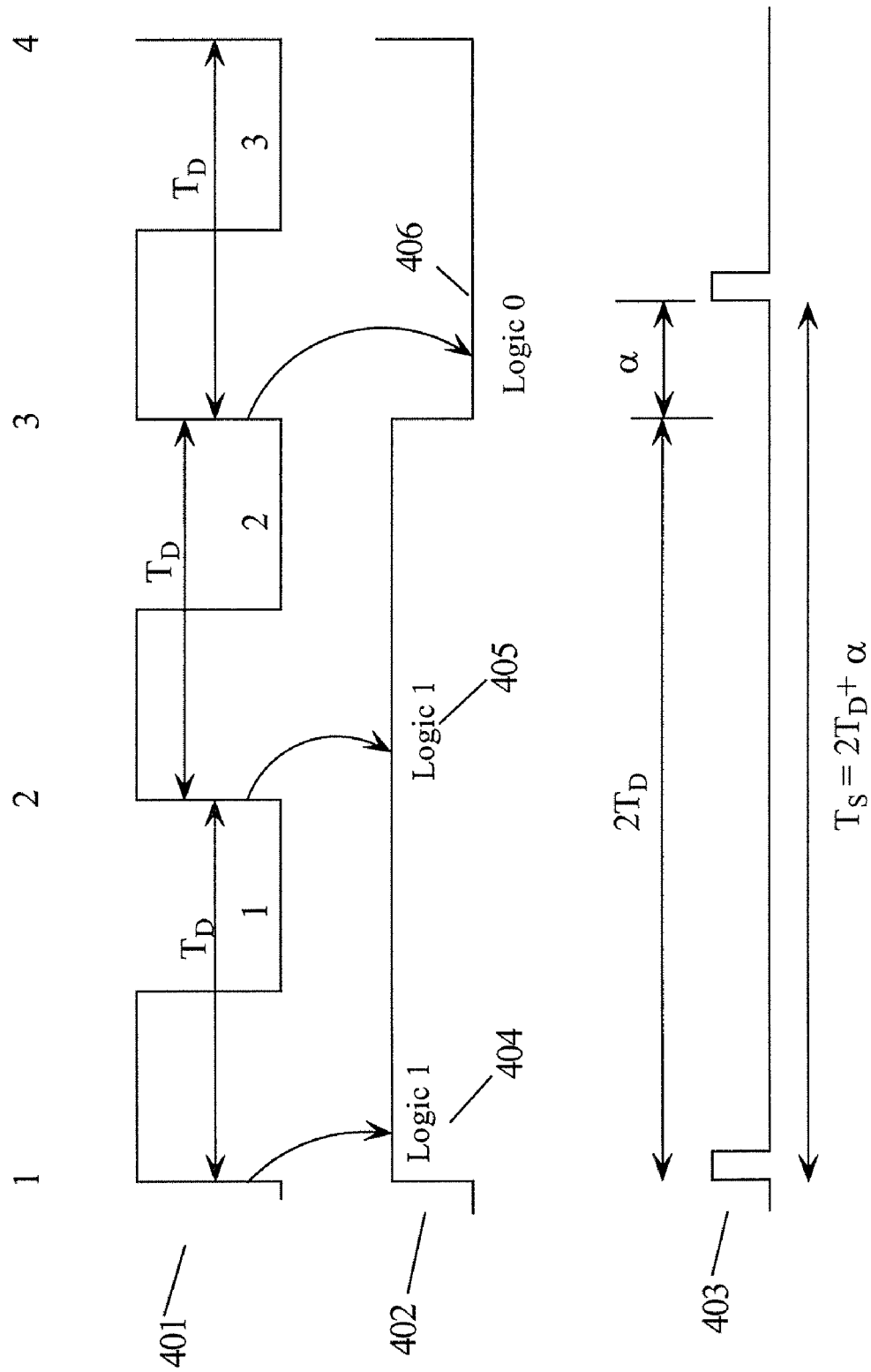
FIG. 4 illustrates waveforms characteristic of a data pattern generated by a data clock and sampled by a corresponding sample clock.

FIG. 4 illustrates a data clock 401 with a period represented by time $T_D$. Logic states 404-406 of the data signal 402 are set on each clock edge (1-4). For example, logic state 404 is set on clock edge 1, logic state 405 is set on clock edge 2 and logic state 406 is set on clock edge 3. Assuming a variable data pattern in data signal 402, over time all transitions (logic 0 to logic 1 and logic 1 to logic zero) will occur at some clock edge N. Data signal 402 is sampled with a sample clock 403 with a period represented by time $T_S$. Sample clock 403, in general, is generated asynchronous with and is not a harmonic of data clock 401. If data signal 402 is sampled with sample clock 403, then sample times may be represented as multiples of the data clock 401 plus a remainder shown as α 407. In FIG. 4 the first sample is shown synchronous with clock edge 1 at time zero (0) to simplify explanation. The sample times may then be shown to be represented by the sequence $[S]=0, T_D+\alpha, 2T_D+2\alpha, 3T_D+3\alpha \ldots KT_D+K\alpha$. If the sample times are normalized relative to the time $T_D$, then the $[S_N]=0, 1+\alpha/T_D, 2+2\alpha/T_D, 3+3\alpha/T_D \ldots K+K\alpha/T_D$. Each element of sequence $[S_N]$ is made up of an integer first term and a fraction last term that is a fraction of the data signal period $T_D$. If the number of samples K is sufficiently large such that there are terms $P\alpha/T_D>1$, then its integer portion is added to the integer first term. Now by dropping the integer term of each element of sequence $[S_N]$, a new sequence $[S_{N1}]$ is generated where each fraction term $P\alpha/T_D<1$ represents a point that falls within the time period $T_D$. This technique results in mapping all of the sample points onto the data clock period $T_D$. In this manner, the data signal 402 may be sampled with a sample clock 403 generating a voltage sequence V[N] and a corresponding N element time sequence $[S_{N1}]$ which will map all of the sample points onto one period of the data clock 401 generating an eye diagram for the data signal path.

If the period $T_S$ sample clock 403 was less than the period $T_D$ of data clock 401, then over sampling would result. Taking a series of K samples in this case again results in a sequence $[S]=0, T_D\alpha, 2T_D\alpha, 3T_D\alpha \ldots KT_D\alpha$. Now if the sample times are normalized relative to the time $T_D$, then the $[S_N]=0, \alpha, 2\alpha, 3\alpha \ldots K\alpha$. The first terms of each sequence $[S_N]$ element are fractions of the data signal period $T_D$. If the number of samples K is sufficiently large such that there are terms $P\alpha>1$, then the integer portion is added as an integer term. Again, by dropping the integer terms that occur in elements of sequence $[S_N]$, a new sequence $[S_{N1}]$ is generated where each term $P\alpha<1$ represents a point that falls within the time period $T_D$.

This technique allows the eye diagram of a sampled data signal to be constructed if the time period of the data clock 401 and the sample clock 403 are known such that the mapped points correspond to actual times the data signal was sampled. In testing data transmission channels between ICs, it would be helpful if a sample clock with a known frequency was not required. Some ICs have many data I/Os and distributing a high speed sample clock may require considerable overhead.

Figure 5:
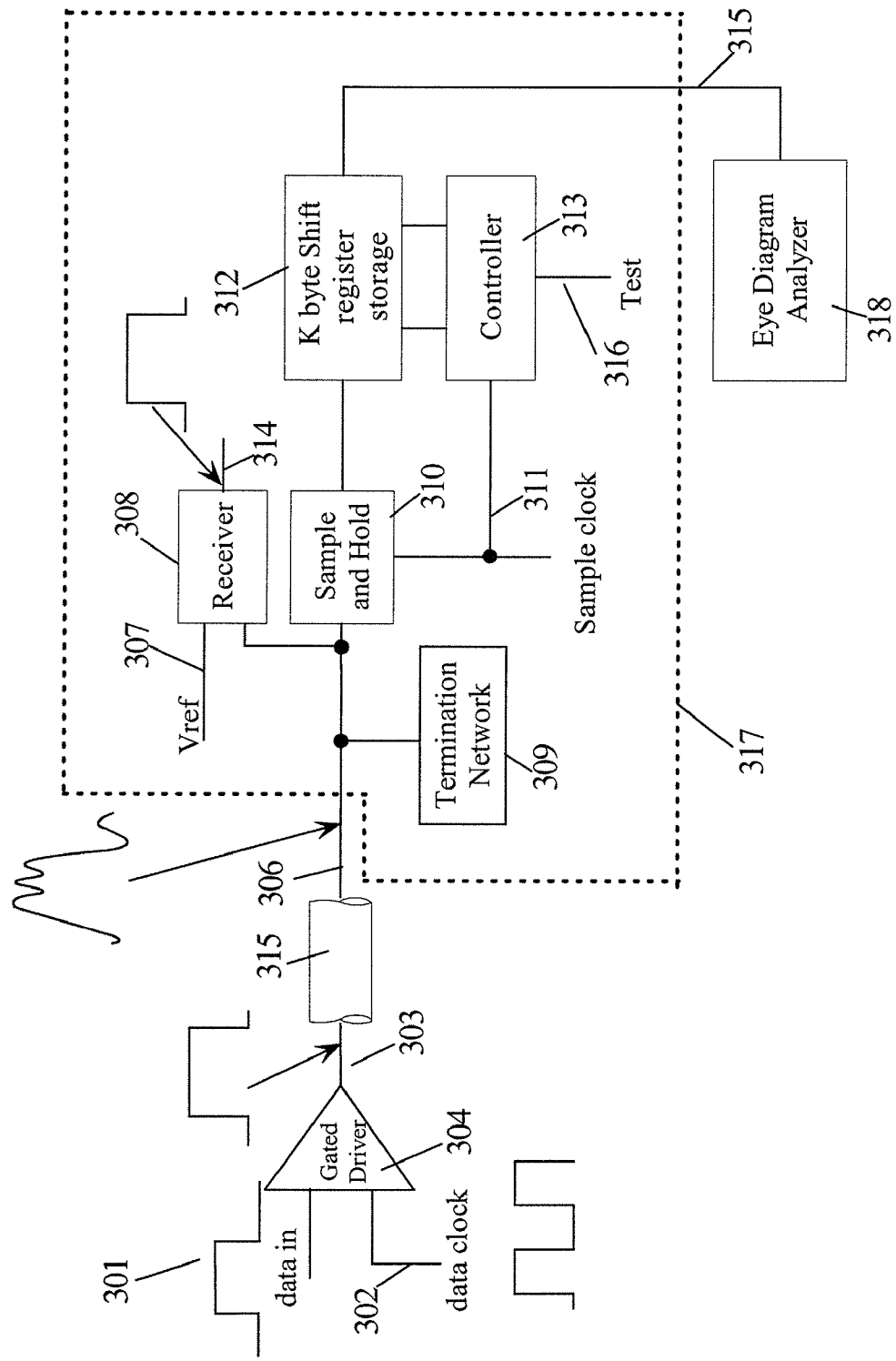
FIG. 5 is a circuit block diagram of a sampling system suitable for acquiring data for embodiments of the present invention.

FIG. 5 illustrates an exemplary data channel according to embodiments of the present invention wherein the construction of an eye diagram used to characterize the data channel is done external to chip 317. In this embodiment, data_in 301 is clocked with data clock 302 to produce data signal 303. Data signal 303 is transmitted over transmission line 315 and arrives distorted as signal 306. Receiver 308 detects signal 306 relative to Vref 307 generating detected data signal 314. Data signal 306 will accumulate, over time, amplitude and timing jitter indicative of variations within the data channel. Analysis of the eye diagram of the data channel will reveal how much margin is available and how to alter the channel design to produce more reliable data transmission.

To generate an eye diagram data, a sample clock 311 is used in conjunction with sample and hold circuitry 310 to produce K samples of detected data signal 314. Controller 313 receives sample clock 311 and test command 316 and determines when to read or write the contents of shift register 312. The data in shift register 312 represents K sequential samples of detected data signal 314. In embodiments of the present invention, the frequency of data clock 302 and/or sample clock 311 need not be known. In this way, the sample clocks may be integrated with groups of data channels. Testing is accomplished by controller 313 signaling analog to digital (A/D) sample and hold circuitry 310 to produce K voltage samples of detected data signal 314 and store them in shift register storage 312 which holds K bytes or words depending on the A/D resolution. At this point, the K voltage samples have no absolute time base and as such cannot be used to produce a representative eye diagram of the data channel.

Embodiments of the present invention empirically determine the "effective" period of sample clock 311. The data in shift register 312 is read out to eye diagram analyzer 318. Analyzer 318 employs method steps, according to embodiments of the present invention, that determine the "effective" period of the actual sample clock that will generate, within a tolerance, a set of times within the data clock period TD that are close to actual time points that correspond to when the sequence of voltage samples V[K] were sampled.

Analyzer 318 estimates a value for sample clock 311. The discussion relative to FIG. 4 explained how a sample clock used to sample a data signal may be, in general, normalized and related to a data clock used to generate the data signal. The period of the data clock is normalized to a value 1. In general, the sample clock may be faster or slower than the data clock. While any technique may be used to make an estimate of the actual value of the sample clock, it is convenient to chose as the first estimate for the sample clock a value ΔTS, a small time increment. Now an iterative process may be used to determine the effective sample clock period TSE by adding ΔTS on successive trials N such that TSE(N+1)=TSE(N)+ΔTS. ΔTS may be made small enough so that the empirically determined effective sample clock TSE will generate time base points close to those produced by the actual unknown sample clock period TS.

One reasonable first choice for ΔTS is to set it equal to a number 1/P where P is chosen as greater than K; the number of samples taken of the data clock. If K is sufficiently large to generate an eye diagram, then the first guess for the sample clock frequency will be P times the data clock frequency. Since all of the sampled data is representative of one cycle of the data clock, it does not matter whether one determines the actual sample clock or a multiple of the actual data clock. What matters is that all of the voltage samples V[K] are mapped closely onto time points within the data clock period TD where they occurred when sampled.

Choosing TSE=1/P and the time base for the voltage samples is created as [K](1/P)=1/P, 2/P, 3/P ... K/P. As recited relative to FIG. 4, the individual terms are truncated by dropping the integer portion. For the first guess, P>K, there will be no terms >1. The eye diagram is "drawn" and the jitter of the created eye diagram is measured and stored in eye diagram analyzer 317. Next, the estimated value for TSE is incremented by 1/P to 2/P. Again the time base is created [K]×(1/P)=2/P, 4/P, 6/P ... 2K/P. In this case, there will be 50% of the terms with integer portions greater than 1. These terms will map back onto the normalized period of 1 when the integer portions are dropped. Again, the eye diagram is "drawn" and the jitter of the created eye diagram is measured. The jitter value is compared to the previous one and the lower one is kept and the other is dropped. This process is continued until a minimum jitter value is determined. The sample clock period corresponding to this minimum jitter value is then equal to or closely equal to the actual sample clock, thus its resulting eye diagram may be analyzed to determine characteristics of the data channel that it represents.

In another embodiment of the present invention, the value of TSE that realizes the eye diagram with the minimum timing jitter (M_TSE) is used as the starting point to further refine the value for TSE. In this case, the process is started by choosing the initial value for TSE as TSE=M_TSE−(N·DTS), wherein N is an integer number and DTS is smaller than DT. In this embodiment, TB[K] is again calculated and the eye diagram formulated and analyzed for timing jitter. TSE is varied around M_TSE to determine if a lower value of timing jitter is realized. In this way, an eye diagram that more closely corresponds to the actual data channel may be realized.

Figure 6A:
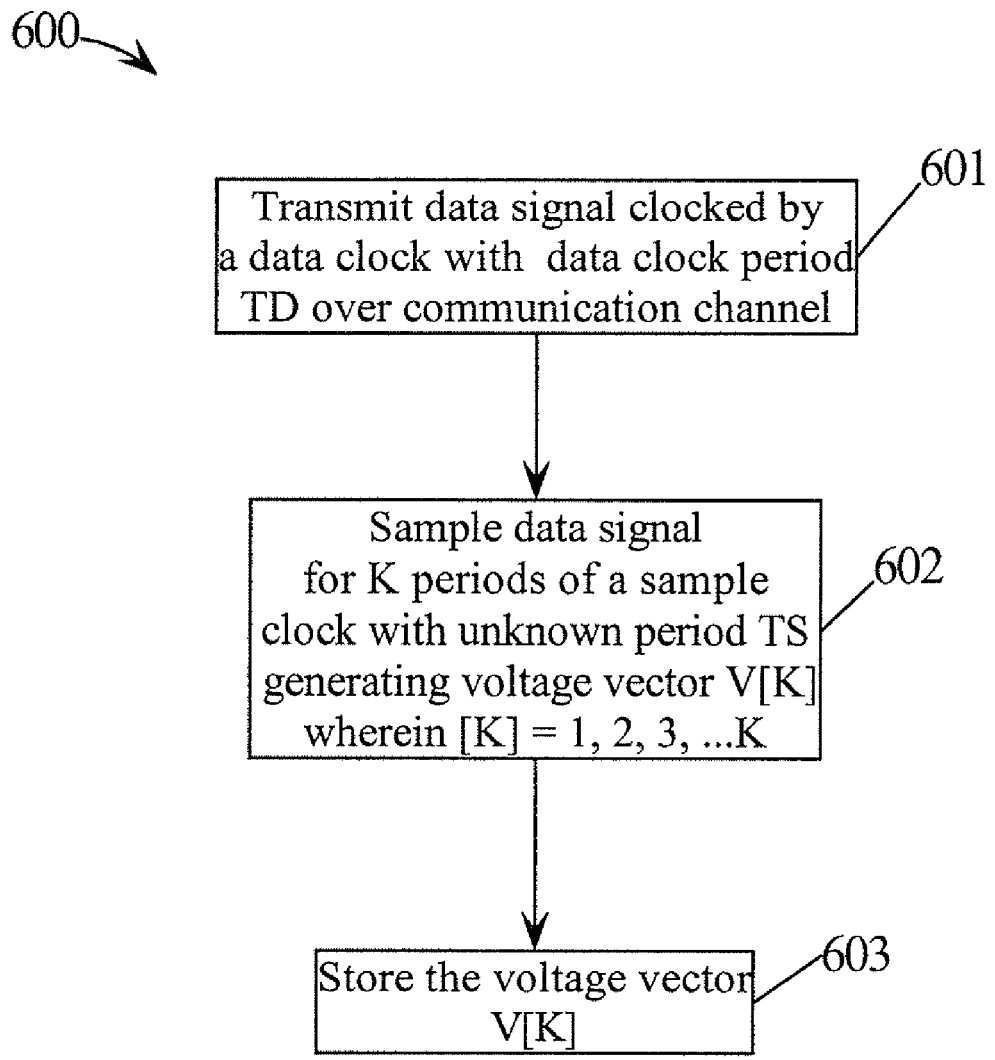
FIG. 6A is a flow diagram of method steps used in embodiments of the present invention to acquire a voltage sequence V[K]

FIG. 6A is a flow diagram 600 for acquiring a voltage vector from a sampled data signal. In step 601, the data signal, clocked with a data clock of period TD, is transmitted over a communication channel. In step 602, the data signal is sampled for a number K periods of a sample clock with unknown period TS thereby generating a voltage vector V[K] wherein [K] is equal to the sequence 1, 2, 3, ... K. In step 603, the voltage vector V[K] is stored for later analysis.

Figure 6B:
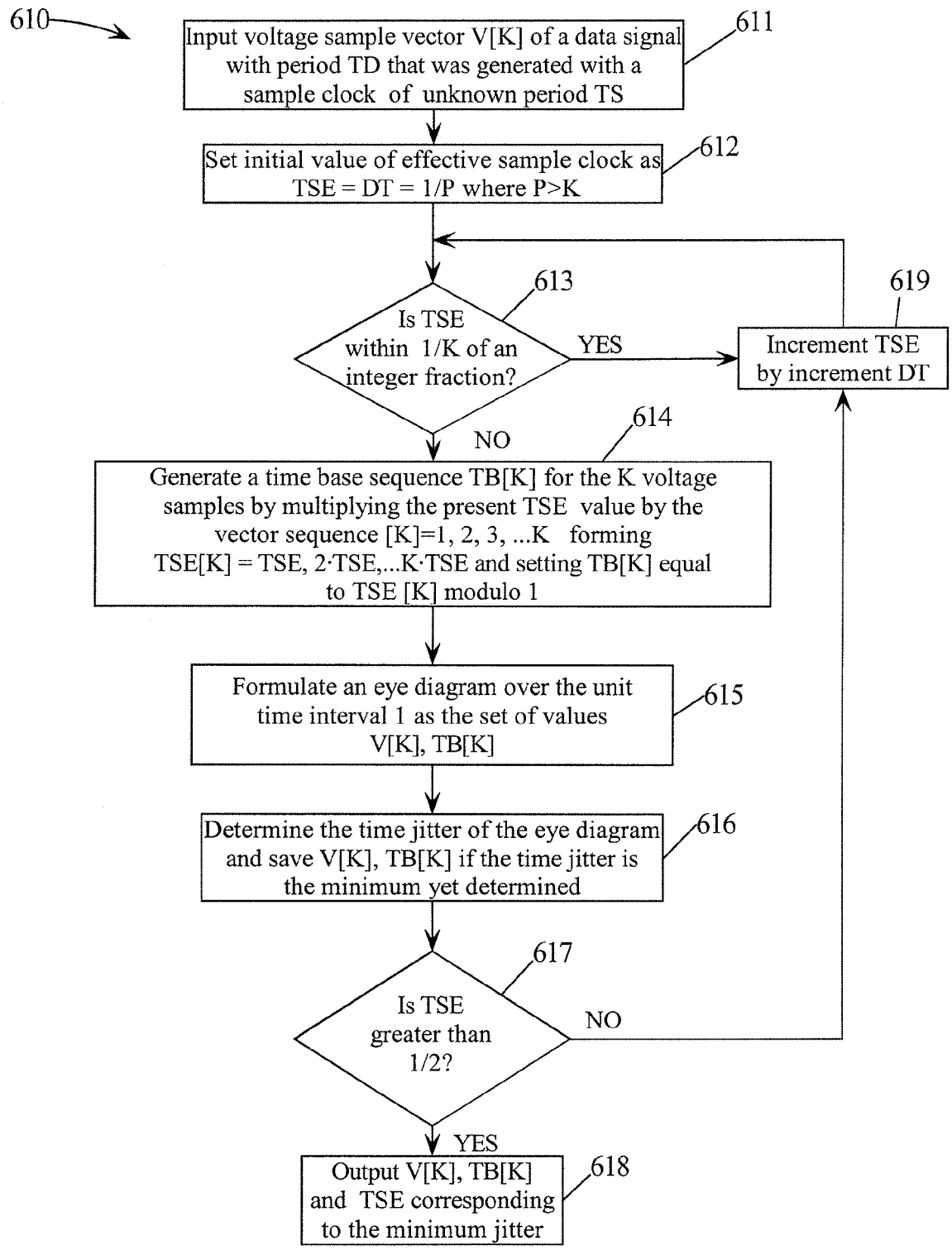
FIG. 6B is a flow diagram of method steps used in embodiments of the present invention to generate a set of values V[K], TB[K] for formulating an eye diagram.

FIG. 6B is a flow diagram 610 of method steps used in embodiments of the present invention to generate a time base TB[K] of time values to correspond to each of the voltage values V[K]. In step 611, V[K] is inputted into the analysis program. In step 612, an initial value for the effective sample clock period TSE is set to a value DT=1/P where P>K (the number of samples taken). In step 613, a test is done to determine if TSE is within 1/K of a selected integer fraction. This step prevents choosing an effective sample clock that is a multiple of the data clock used to generate the data signal. While tests for any integer fraction of the time period may be used, in one embodiment the present invention tests for selected integer fractions of ½, ⅓, ¼, ⅕, ⅖, ⅙, 2/7, and 3/7. In general the integer fraction corresponds to the integer fraction of the time interval T (e.g., T/2, T/3, ... ) over which the eye diagram will be generated. For example if TD is known then T may be set equal to TD. When normalizing of the time interval 1, then T is set to 1.

If the result of the test in step 613 is YES, then in step 619 TSE is incremented by DT and step 613 is repeated. If the result of the test in step 613 is NO, then in step 614 a time base sequence TB[K} is generated for V[K] by multiplying the value of TSE by [K] forming TSE[K] and retaining only the decimal fraction of each term, thus setting TB[K] equal to TSE[K] modulo 1. This In step 615 an eye diagram is formulated over the unit time interval 1 as the set of values V[K], TB[K]. In step 616, the time jitter TJ of the eye diagram is determined and the values of V[K], TB[K] are saved if the value of TJ is less than a previous value of TB[K]. In step 617, a test is done to determine if TSE is greater than ½. This step assumes the eye diagram is symmetrical over the unit time interval 1 and thus only one-half of the unit time interval needs to be used for the eye diagram. If the result of the test in step 671 is NO, then in step 619 TSE is incremented by DT and the steps starting at step 613 are repeated. If the result of the test in step 617 is YES, then the values TB[K] that generate the minimum TJ are saved and an eye diagram representative the data signal transmitted over the communication channel may be analyzed. The set of points V[K], TB[K] and the value of TSE may be used for further analysis.

Figure 6C:
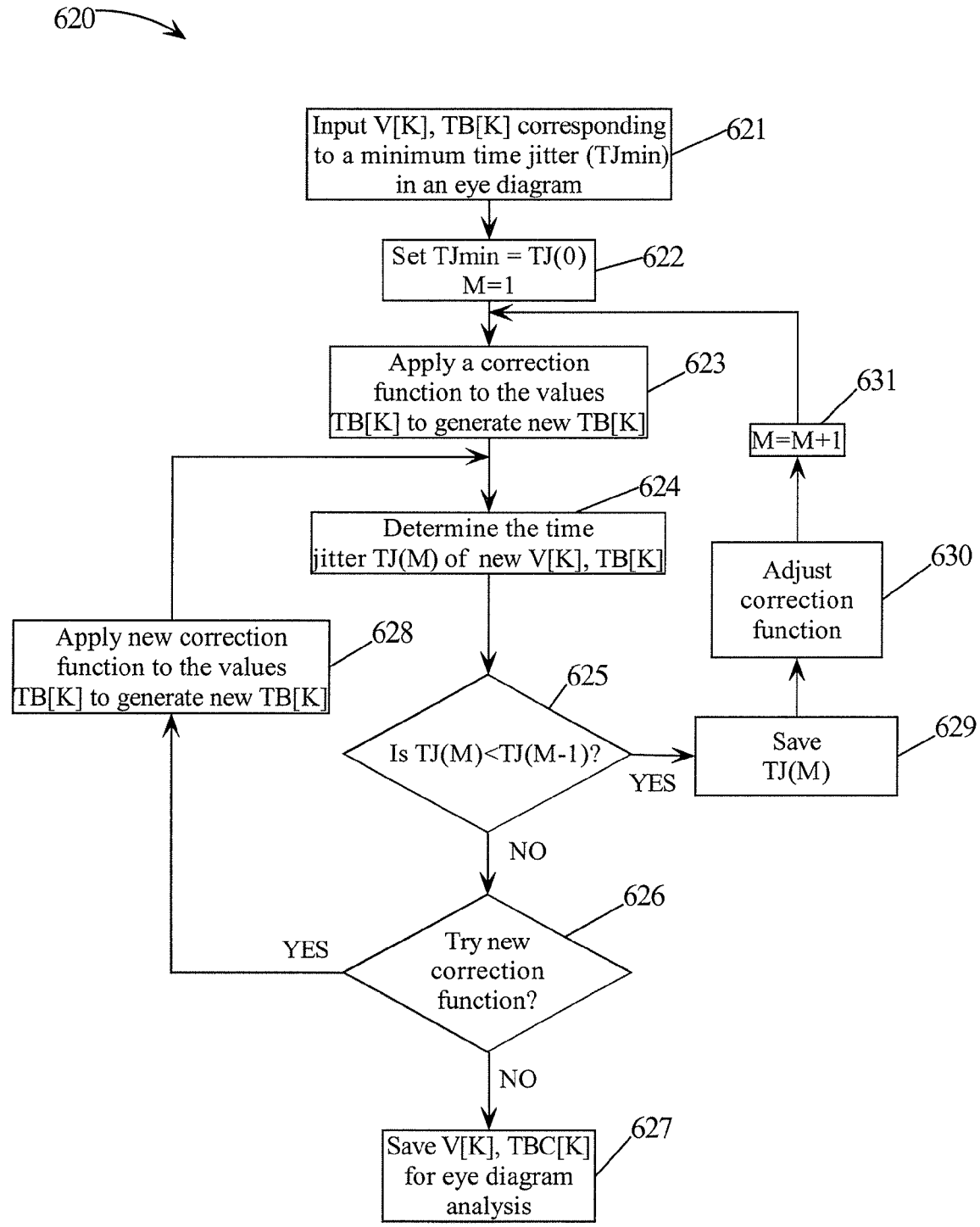
FIG. 6C is a flow diagram of method steps used in embodiments of the present invention to correct for frequency drift.

FIG. 6C is a flow diagram 620 of method steps used in embodiments of the present invention wherein correction is applied to compensate for frequency drift or change occurring when sampling a data signal. In step 621, the set of values V[K], TB[K] corresponding to a minimum time jitter TJmin in an eye diagram formulated according to the method steps of FIG. 6B. In step 622, the TJmin is set to TJ(0) and an index M is set to a value 1. In step 623, a correction function is applied to the values TB[K] to generate new values TB[K]. In step 624, the present time jitter TJ(M) is determined for the new set of values V[K], TB[K]. In step 625, a test is done to determine if TJ(M)<TJ(M−1). If the result of the test in step 625 is YES, then TJ(N) is saved and the correction function is adjusted in step 630. In step 631, index M is incremented by 1 and in step 623 the adjusted correction again applied to TB[K] to generate new TB[K]. Steps 623-625 and 629-630 are repeated until the result of the test in step 625 is NO. In this case, a test is done in step 626 to determine if a new correction function should be applied. If the result of the test in step 626 is YES, then a new correction function may be applied in step 628 and a branch taken back to step 623. If the result of the test is NO, then in step 627 the present set of values V[K], TB[K] are saved for analysis.

Figure 7A:
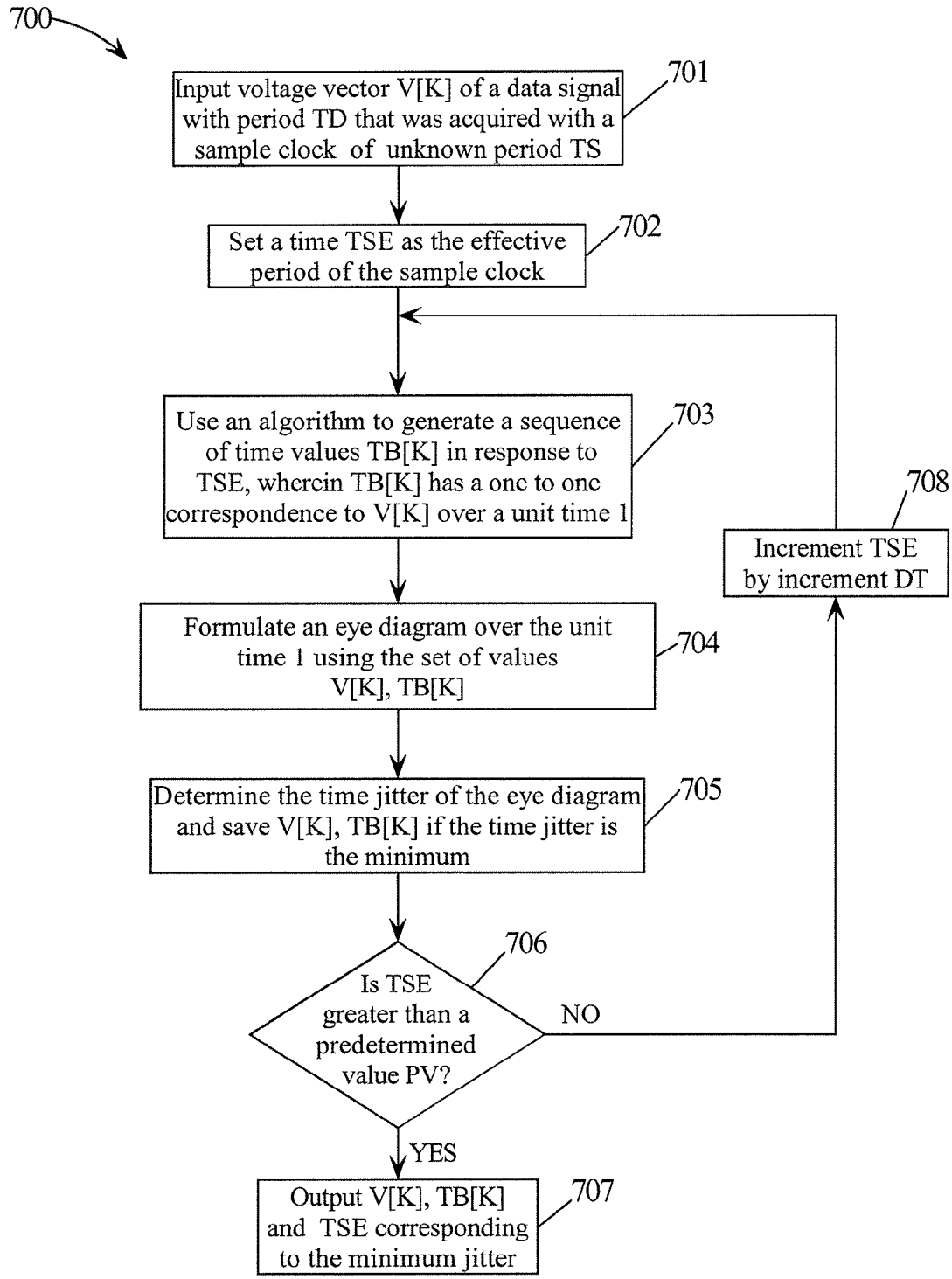
FIG. 7A is a flow diagram of method steps used in embodiments of the present invention.

FIG. 7A is a flow diagram of method steps 700 used in embodiments of the present invention. In step 701, a voltage vector V[K] is inputted that was acquired from a data signal with period TD using a sample clock with unknown period TS. In step 702, a time period TSE is set as the effective period of the sample clock. In step 703, a predetermined algorithm is used to generate a sequence of time values TB[K] in response to the value TSE, wherein TB[K] has a one to one correspondence to V[K] over a unit time interval of 1. In step 704, an eye diagram is formulated over the unit time interval 1 using the set of values V[K], TB[K]. In step 705, the time jitter TJ of the eye diagram is determined and saved if the present time jitter TJ(M) is less than a previous time jitter TJ(M−1). In step 706, a test is done to determine if the value of TSE is greater than a predetermined value PV indicating that enough iterations of TSE have been tried to construct a viable eye diagram. If the result of the test in step 706 is NO, then in step 708 TSE is incremented by an increment DT and a branch is taken back to step 703. If the result of the test in step 706 is YES, then the present set of values V[K], TB[K] and the present TSE are saved and outputted.

Figure 7B:
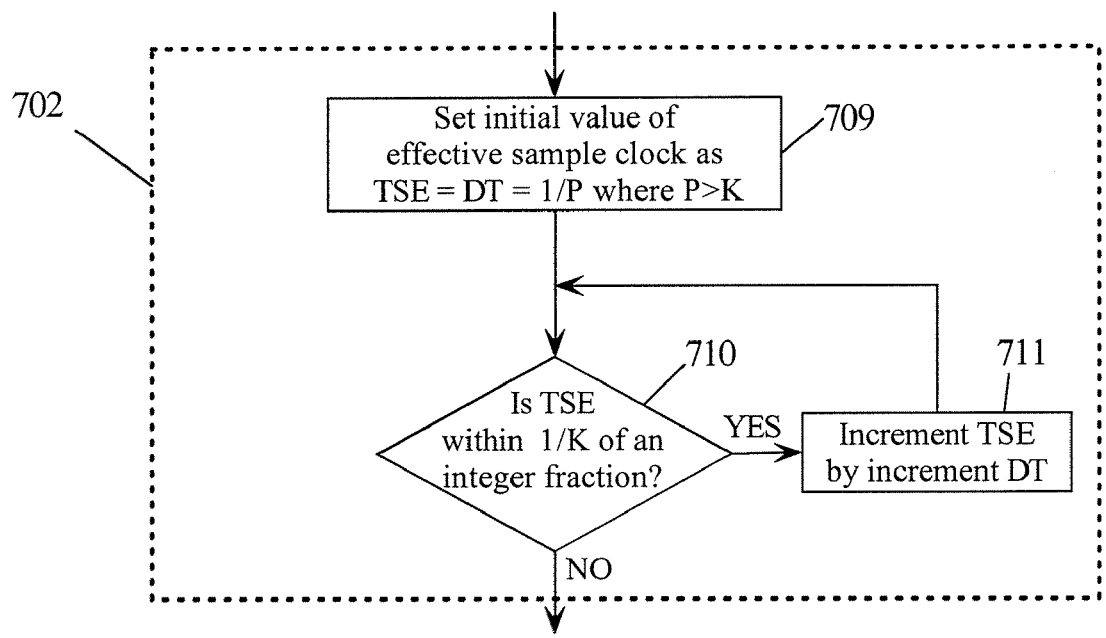
FIG. 7B is a flow diagram of method steps used in embodiments of the present invention to estimate a value for effective time period TSE.

FIG. 7B is a flow diagram of sub-steps with in step 702 in FIG. 7A. In step 709, an initial value of TSE is set to DT=1/P where P>K. In step 710, a test is done to determine if the value of TSE is within T/K of an integer fraction. If the result of the test in step 710 is YES, then in step 711 TSE is incremented by DT and step 710 is repeated. If the result of the test in steps 710 is NO, then the initial value of TSE is set for the next step.

Figure 7C:
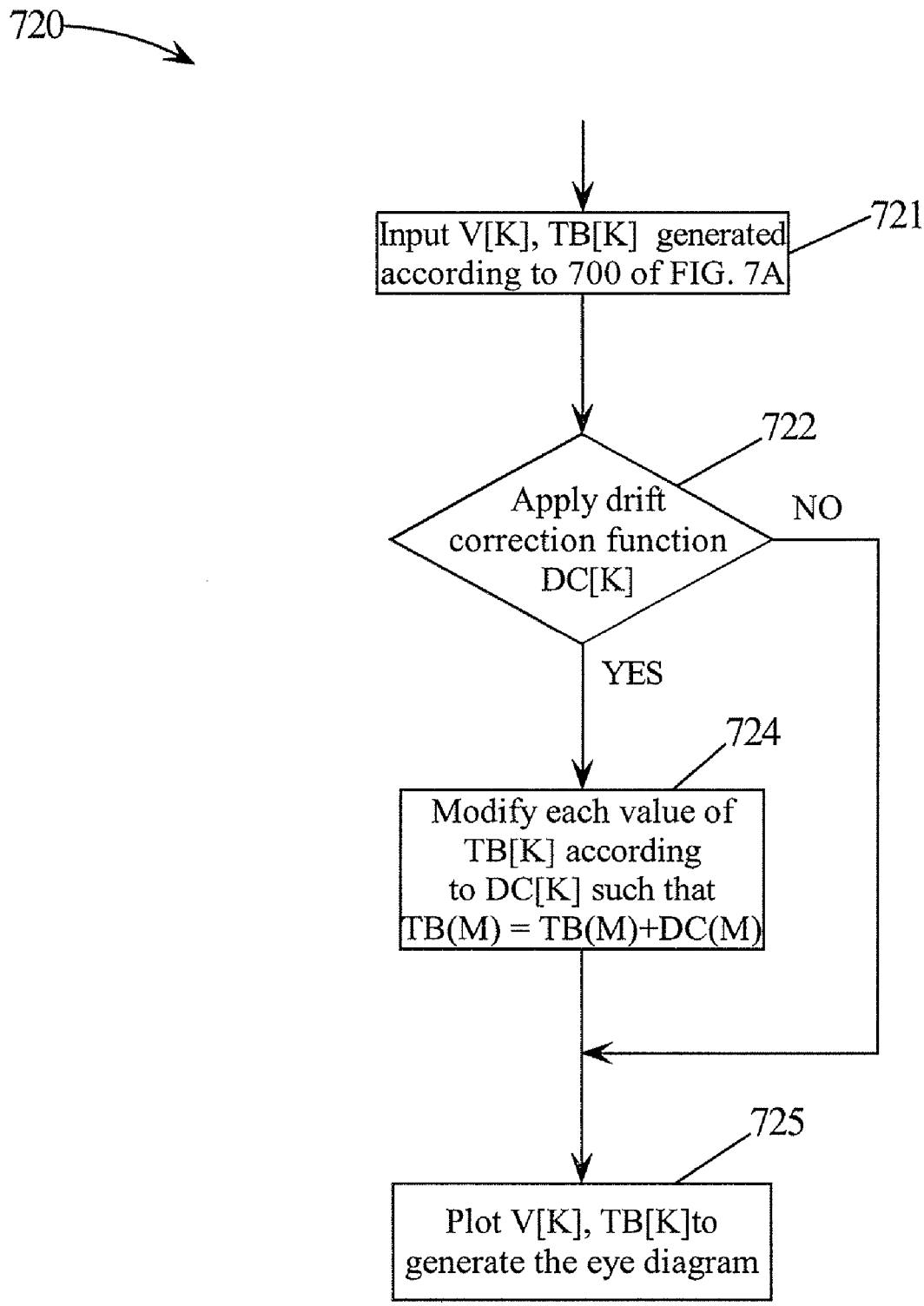
FIG. 7C is a is a flow diagram of method steps used in embodiments of the present invention to generate an eye diagram from values of V[K] with compensation for frequency drift.

FIG. 7C is a flow diagram 702 use to correct values of TB[K], determined in the steps 701-708 of FIG. 7A, for errors caused by frequency drift occurring while acquiring voltage sequence V[K]. In step 721, the determined set of values V[K], TB[K] are inputted. In step 722, a test is done to determine if a drift correction function DC[K] is to be used. If a correction function is used, then in step 724 each value of TB[K] is modified according to DC[K] such that a particular term TB(M) of TB[K] has a corresponding term DC(M) added. The mathematical sign of DC(M) is determined by the particular function DC[K]. In step 725, the corrected eye diagram is plotted as the set of points V[K], TB[K] wherein the values TB[K] are corrected values.

Figure 7D:
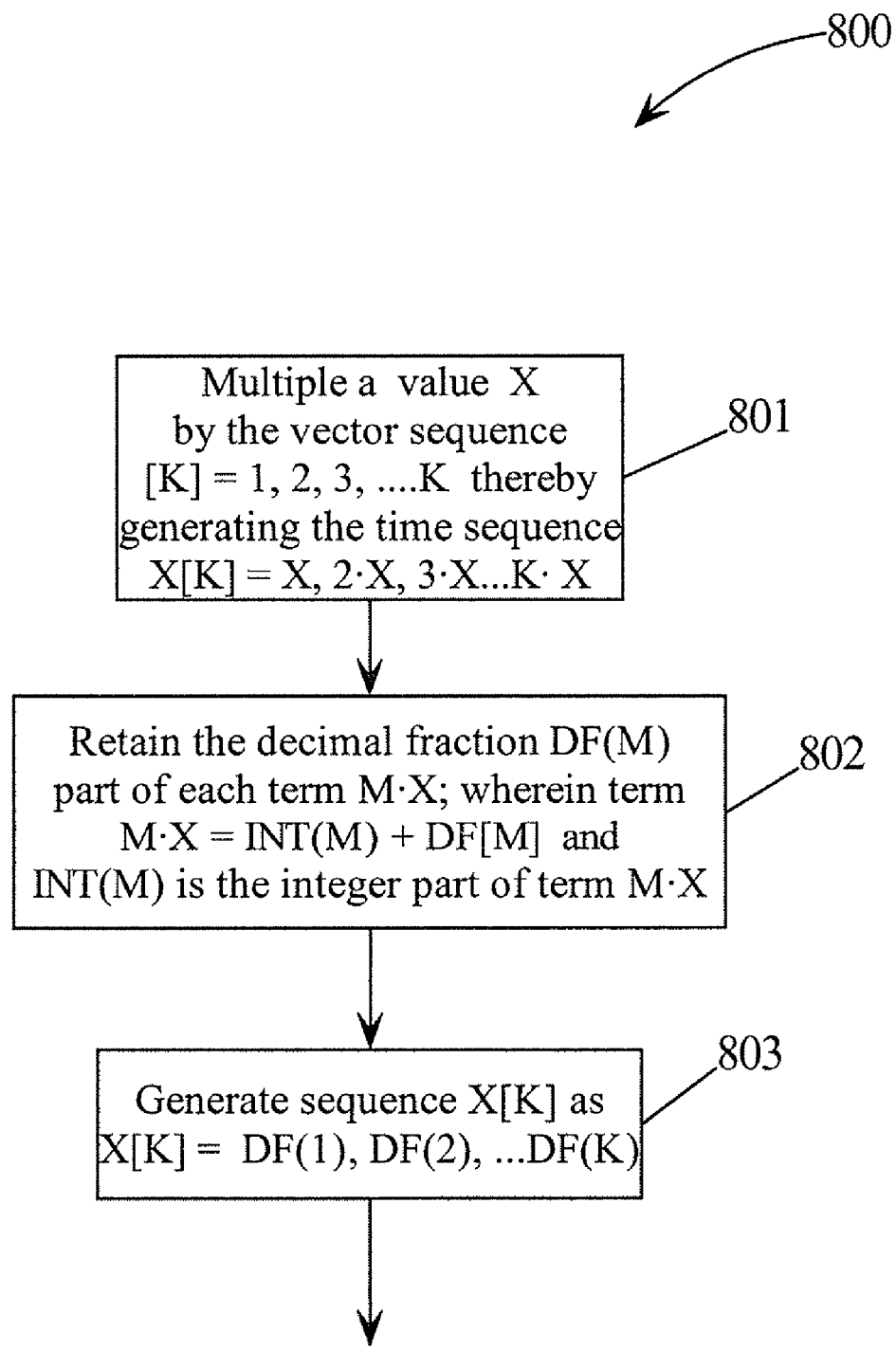
FIG. 7D is a flow diagram of method steps of an algorithm used in embodiments of the present invention.

FIG. 7D is a flow diagram 800 of method steps for the predetermined algorithm in step 703 of method steps 700 in FIG. 7A. In step 801, a value X is multiplied times a vector sequence [K]=1, 2, 3, . . . K thereby generating the sequence X[K]=(1·X), (2·X), (3·X), . . . (K·. In step 802, only the decimal fraction DF(M) part of each term (M·X) is retained wherein (M·X)=INT(M)+DF(M) and INT(M) is the integer part of term (M·X). In step 803, the sequence X[K] is generated as X[K]=DF(1), DF(2), DF(3), . . . DF(K). In step 703, the algorithm substitutes TSE for X.

Figure 7E:
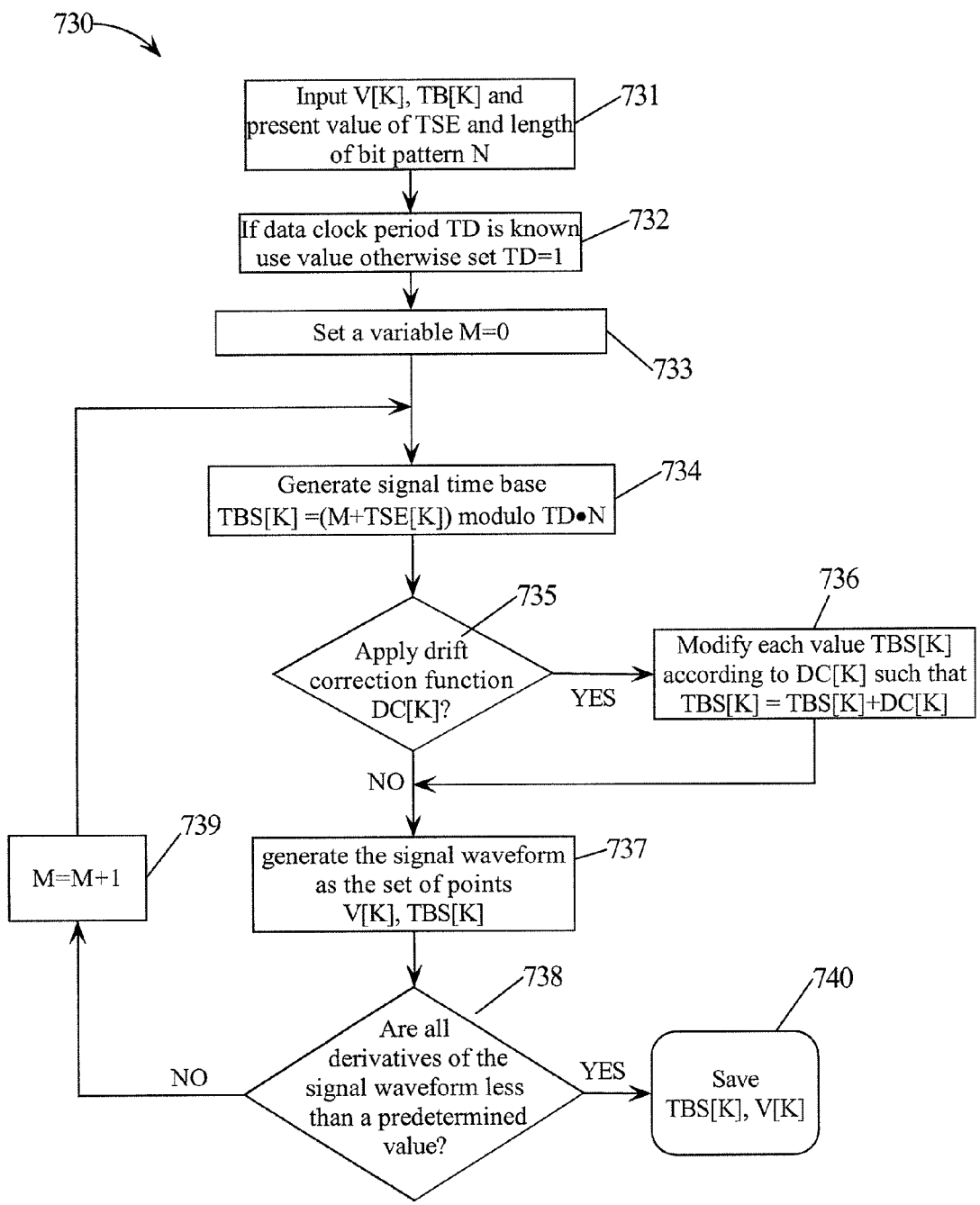
FIG. 7E is a flow diagram of method steps used in embodiments of the present invention to formulate a signal waveform from sample value V[K].

FIG. 7E is a flow diagram 730 of method steps used in embodiments of the present invention to regenerate the data signal waveform corresponding to the values voltage sequence V[K] and the value TSE that generates a minimum TJ as described relative to FIGS. 6B, 6C and 7A. In step 731, V[K], the value of TSE and the length N of the bit pattern making up data signal are inputted. In step 732, the value of the period TD of the data signal is used if known, otherwise TD is set equal to 1. In step 732, a variable M is set to an initial value of 0. In step 733, a signal time base TBS[K] is set equal to (M+TSE[K]) modulo TD·N. In step 735, a test is done to determine whether to apply a frequency drift correction function DC[K]. If a drift correction function DC[K] is to be applied, then in step 736 each value of TBS[K] are modified according to DC[K] such that TBS[K]=TBS[K]+DC[K] and a branch is taken to step 737. If drift correction is not applied, then a direct branch to step 737 is taken. In step 737, the set of values V[K], TBS[K] are used to generate a signal waveform. In test 738, a test is done to determine if the derivative of the signal waveform of step 737 at all points is less than a predetermined value indicating the signal waveform represents a continuous function. If the result of the test in step 738 is YES, then the process is ended in step 740 and the values TBS[K], V[K] of the signal waveform representative of the data signal are saved and my be used to analyze the data signal. If the result of the test in step 738 is NO, then in step 739 variable M is incremented by 1 and a branch is taken back to step 734.

It should be reiterated that it is not necessary to determine the actual TS for the sample clock used to generate V[K]. It is only necessary to determine an effective sample clock with period TSE that would sample the data signal at the same times as the actual sample clock with period TS. The effective sample clock needs to be sufficiently close to the actual sample clock such that TSE=Q·TS (within a desired tolerance) where Q may be any integer or integer fraction.

Although the present invention and its advantages have been described in detail, it should be understood that various changes, substitutions and alterations can be made herein without departing from the spirit and scope of the invention as defined by the appended claims.

What is claimed is:

1. A method for determining an eye diagram suitable for analyzing performance of a data channel, comprising the steps of:

a) receiving over the data channel and at a first circuitry in an integrated circuit (IC), a sequence of voltage samples asynchronously acquired from a data signal with period TD using a sample clock in the integrated circuit with period TS, wherein values of TD and TS may not be known, the data channel being an electrical data communication pathway between the IC and second IC;

b) setting using a second circuitry, an initial value of an effective time period TSE for the sample clock;

c) generating using a third circuitry, a sequence of time values TB in response to the value of TSE, wherein the sequence of time values TB has a correspondence with the sequence of voltage samples over a time period T;

d) formulating using a fourth circuitry, an eye diagram by locating the sequence of voltage samples within the time period T at a corresponding one of the sequence of time values TB;

e) determining using a fifth circuitry, a timing jitter for the eye diagram and saving a minimum determined value of the timing jitter as TJ(min) and the sequence of time values TB corresponding to TJ(min); and f) adjusting using a sixth circuitry, the value of TSE and repeating selected of the steps c)-e) until the value of TSE is greater than a predetermined value;

wherein the sequence of voltage samples comprises a sequence of number K voltage samples V[K] where [K] is the number sequence 1, 2, 3, . . . K and V[K] =V(1), V(2), V(3), . . . V(K) and the sequence of time values TB comprise a sequence of K time values TB[K];

wherein the initial value of TSE is set to a predetermined value DT and the value of TSE is incremented by DT if TSE is adjusted to be within a value T/K of a selected integer fraction of T;

wherein generating the sequence of time values TB[K] comprises the steps of:

multiplying the value of TSE by the sequence [K] thereby generating the sequence TSE[K]=(1·TSE), (2·TSE), (3·TSE), . . . (K·TSE); and setting TB[K]=TSE[K] modulo T;

wherein formulating the eye diagram suitable for analyzing the performance of the one or more data channel comprises the steps of:

g) inputting the set of values V[K] and TB[K] corresponding to the TJ(min);

h) modifying the values of TB[K] using a correction function DC[K] thereby forming TBC[K], wherein each term of TBC[K] corresponds to each term of TB[K] modified by adding a corresponding term of DC[K];

i) formulating a new eye diagram using a set of values V[K], TBC[K];

j) determining a timing jitter of the new eye diagram; and k) saving the set of values V[K], TBC[K] if the timing jitter of the new eye diagram is less than TJ(min); and adjusting the correction function DC[K] and repeating from step h).

2. A method for determining an eye diagram suitable for analyzing performance of a data channel of an integrated circuit (IC), comprising the steps of:

a) receiving a sequence of voltage samples asynchronously acquired from a data signal with period TD using a sample clock with period TS, wherein values of TD and TS may not be known;

b) setting an initial value of an effective time period TSE for the sample clock;

c) generating a sequence of time values TB in response to the value of TSE, wherein the sequence of time values TB has a correspondence with the sequence of voltage samples over a time period T;

d) formulating an eye diagram by locating the sequence of voltage samples within the time period T at a corresponding one of the sequence of time values TB;

e) determining a timing jitter for the eye diagram and saving a minimum determined value of the timing jitter as TJ(min) and the sequence of time values TB corresponding to TJ(min); and f) adjusting the value of TSE and repeating selected of the steps c)-e) until the value of TSE is greater than a predetermined value.

3. The method of claim 2, wherein the sequence of voltage samples comprises a sequence of number K voltage samples V[K] where [K] is the number sequence 1, 2, 3, . . . K and V[K]=V(1), V(2), V(3), . . . V(K) and the sequence of time values TB comprise a sequence of K time values TB[K].

4. The method of claim 3, wherein the initial value of TSE is set to a predetermined value DT and the value of TSE is incremented by DT if TSE is adjusted to be within a value T/K of a selected integer fraction of T.

5. The method of claim 4, wherein generating the sequence of time values TB[K] comprises the steps of:
   multiplying the value of TSE by the sequence [K] thereby generating the sequence TSE[K]=(1TSE), (2TSE), (3TSE), . . . (KTSE); and
   setting TB[K]=TSE[K] modulo T.

6. The method of claim 5, wherein the selected integer fraction of T is selected from the set of fractions comprising T/2, T/3, T/4, T/5, 2T/5, T/6, T/7, 2T/7, and 3T/7.

7. The method of claim 5, further comprising the steps of:
   m) inputting a length N of a bit pattern forming the data signal and an effective sample clock period TSE;
   n) sweeping an integer variable M over the values 0, 1, 2 . . . N;
   o) generating a sequence of K signal time values TBS[K]= (M+TSE[K]) modulo (TDN); and
   p) returning the value of M and TBS [K] when the time derivative of the signal waveform V[K] at all TBS [K] is less than a predetermined value.

8. The method of claim 2, wherein T is the unit time period equal to one.

9. The method of claim 2, wherein T is the period TD of the data signal.

10. The method of claim 4, wherein DT is less than the ratio 1/K.

11. The method of claim 3, further comprising the steps of:
   a) transmitting the data signal clocked from a first IC, wherein the data signal is clocked with a data clock having the clock period TD;
   b) receiving the data signal at an input of a second IC;
   c) generating a digitized voltage sample V by sampling the data signal at the second IC with the sample clock; and
   d) storing the number K sequential values of V as the voltage sequence V[K] in the second IC, wherein V[K] is equal to the sequence V(1), V(2), V(3) . . . V(K).

12. The method of claim 11, wherein the second IC comprises:
   the sample clock having the period TS;
   circuitry for taking K sequential voltage samples of the data signal for K sequential periods TS of the sample clock;
   circuitry for digitizing and storing each of the K sequential voltage samples as a voltage sequence V[K]; and
   circuitry for reading out the voltage sequence V[K] in response to a test command to external circuitry configured to generate a test eye diagram corresponding to one of the one or more data channels.

13. The method of claim 2, wherein TS is greater than TD.

14. The method of claim 2, wherein TS is less than TD.

15. The method of claim 3, wherein V[K] is representative of a group of data channels.

16. The method of claim 2, wherein the predetermined value is one half of either the data signal period TD or the unit time interval 1.

17. The method of claim 2, further comprising the step of applying a correction term to compensate for a frequency drift in the sample clock or data clock occurring over a time period in which the sequence of voltage samples were acquired.

18. A method for determining an eye diagram suitable for analyzing a performance of one or more data channels used for communicating between two integrated circuits (ICs) comprising the steps of:
   inputting a sequence of voltage samples taken by sampling, with a sample clock with unknown period TS, a data signal transmitted over the one or more data channels;
   generating a time base as a sequence of time values for the sequence of voltage samples using a predetermined algorithm, wherein the time base has a correspondence to the sequence of voltage samples over a time period T;
   formulating an eye diagram using the voltage samples and time base; modifying the time base and reformulating the eye diagram until a time jitter of the eye diagram is a minimum value; and
   using the time base resulting in the minimum time jitter to formulate the eye diagram suitable for analyzing the performance of the data channel.

19. The method of claim 18, wherein the predetermined algorithm comprises the steps of:
   setting an effective period TSP for the sample clock to have an initial value equal to a predetermined value DT;
   incrementing the value TSE by the value DT if TSE is within a value T/K of an integer fraction T/2, T/3, T/4, T/5, 2T/5, T/6, T/7, 2T/7, and 3T/7 multiplying the value of TSE by a sequence of numbers [K]=(1), (2), (3), . . . (K) thereby generating a time sequence TSE[K]= (1TSE), (2TSE), (3TSE), . . . (KTSE); and
   setting TB[K]=TSE[K] modulo T.

20. A means for determining an eye diagram suitable for analyzing a performance one or more data channels used for communicating between two integrated circuits (ICs), comprising:
   circuitry for receiving a sequence of voltage samples asynchronously acquired from a data signal with period TD using a sample clock with period TS, wherein values of TD and TS may not be known;
   circuitry for setting an initial value of an effective time period TSE for the sample clock;
   circuitry for generating a sequence of time values TB in response to the value of TSE, wherein the sequence of time values TB has a correspondence with the sequence of voltage samples over a time period T;
   circuitry for formulating an eye diagram by locating each of the sequence of voltage samples within the time period T at a corresponding one of the sequence of time values TB;
   circuitry for determining a timing jitter for the eye diagram and saving a minimum determined value of the timing jitter as TJ(min) and the sequence of time values TB corresponding to TJ(min); and
   circuitry for adjusting the value of TSE and repeating selected of the steps c)-e) until the value of TSE is greater than a predetermined value.

* * * * *